(12) United States Patent
Kobayashi et al.

(10) Patent No.: US 12,684,783 B2
(45) Date of Patent: Jul. 14, 2026

(54) RECONFIGURABLE TRANSISTOR DEVICE

(71) Applicant: Qorvo US, Inc., Greensboro, NC (US)

(72) Inventors: Kevin Wesley Kobayashi, Redondo Beach, CA (US); Julio C. Costa, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 958 days.

(21) Appl. No.: 17/772,652

(22) PCT Filed: Nov. 14, 2020

(86) PCT No.: PCT/US2020/060621
§ 371 (c)(1),
(2) Date: Apr. 28, 2022

(87) PCT Pub. No.: WO2021/097374
PCT Pub. Date: May 20, 2021

(65) Prior Publication Data

US 2022/0392958 A1     Dec. 8, 2022

Related U.S. Application Data

(60) Provisional application No. 62/935,662, filed on Nov. 15, 2019.

(51) Int. Cl.
H10B 63/00 (2023.01)
H10D 30/47 (2025.01)
(Continued)

(52) U.S. Cl.
CPC ........... H10B 63/30 (2023.02); H10D 30/475 (2025.01); H10D 62/8503 (2025.01);
(Continued)

(58) Field of Classification Search
None
See application file for complete search history.

(56) References Cited

U.S. PATENT DOCUMENTS

| | | | |
|---|---|---|---|
| 9,257,647 B2 | 2/2016 | Borodulin et al. | |
| 9,368,720 B1 | 6/2016 | Moon et al. | |
| | (Continued) | | |

FOREIGN PATENT DOCUMENTS

| | | |
|---|---|---|
| CN | 109599487 A | 4/2019 |
| DE | 69631451 T2 | 12/2004 |

OTHER PUBLICATIONS

Office Action for German Patent Application No. 112020005771.2, mailed Jun. 30, 2024, 14 pages.
(Continued)

*Primary Examiner* — Steven B Gauthier
*Assistant Examiner* — E. Rhett Cheek
(74) *Attorney, Agent, or Firm* — Withrow & Terranova, P.L.L.C.

(57) ABSTRACT

Disclosed is a reconfigurable transistor device having a substrate, a plurality of first transistor fingers disposed in a first region over the substrate, and a phase change switch (PCS) having a patch of a phase change material (PCM) disposed over the substrate in a second region to selectively couple a first set of the plurality of first transistor fingers to a bus, wherein the patch of the PCM is electrically insulating in an amorphous state and electrically conductive in a crystalline state. The PCS further includes a thermal element disposed adjacent to the patch of PCM, wherein the first thermal element is configured to maintain the patch of the PCM to within a first temperature range until the patch of the PCM converts to the amorphous state and maintain the patch of the PCM within a second temperature range until the first patch of PCM converts to the crystalline state.

27 Claims, 6 Drawing Sheets

(51) Int. Cl.
| | |
|---|---|
| *H10D 62/85* | (2025.01) |
| *H10N 70/00* | (2023.01) |
| *H10N 70/20* | (2023.01) |

(52) U.S. Cl.
CPC ......... *H10N 70/231* (2023.02); *H10N 70/823* (2023.02); *H10N 70/8413* (2023.02); *H10N 70/8828* (2023.02); *H10N 70/8833* (2023.02)

(56) References Cited

U.S. PATENT DOCUMENTS

| | | | |
|---|---|---|---|
| 9,917,104 B1 | 3/2018 | Roizin et al. | |
| 10,454,027 B1 | 10/2019 | Howard et al. | |
| 10,461,253 B1 | 10/2019 | Slovin et al. | |
| 10,475,993 B1 | 11/2019 | Slovin et al. | |
| 10,476,001 B1 | 11/2019 | Rose et al. | |
| 2001/0032999 A1* | 10/2001 | Yoshida | H10D 12/481 |
| | | | 257/E29.081 |
| 2009/0201715 A1* | 8/2009 | Kreupl | G11C 13/0007 |
| | | | 257/E21.004 |
| 2011/0090038 A1 | 4/2011 | Perchlik | |
| 2012/0083127 A1* | 4/2012 | Clark | H01L 21/31116 |
| | | | 257/E21.214 |
| 2012/0091423 A1* | 4/2012 | Sumino | H10N 70/8836 |
| | | | 257/E47.001 |
| 2014/0166957 A1* | 6/2014 | Yang | H10N 70/8833 |
| | | | 257/1 |
| 2014/0191181 A1* | 7/2014 | Moon | H10N 70/011 |
| | | | 257/4 |
| 2014/0264230 A1 | 9/2014 | Borodulin et al. | |
| 2016/0056373 A1 | 2/2016 | Goktepeli et al. | |
| 2017/0256377 A1* | 9/2017 | Reig | H10N 70/8413 |
| 2019/0305043 A1* | 10/2019 | Carta | H10N 70/826 |
| 2020/0058851 A1 | 2/2020 | El-Hinnawy et al. | |
| 2020/0133033 A1* | 4/2020 | Bhaskaran | H10B 63/24 |
| 2022/0415832 A1 | 12/2022 | Kobayashi et al. | |
| 2025/0386537 A1* | 12/2025 | Arnold | H10D 1/47 |

OTHER PUBLICATIONS

Author Unknown, "Phase-Change Materials and Switches for Enabling Beyond-CMOS Energy Efficient Applications," 2020, https://phasechange-switch.org/, 2 pages.

Bedair, S. et al., "High-Performance Micromachined Inductors Tunable by Lead Zirconate Titanate Actuators," IEEE Electron Device Letters, vol. 33, Issue 10, Aug. 2012, IEEE, pp. 1483-1485.

El-Nozahi, M. et al., "A CMOS Low-Noise Amplifier With Reconfigurable Input Matching Network," IEEE Transactions on Microwave Theory and Techniques, vol. 57, No. 5, Apr. 2009, IEEE, pp. 1054-1062.

Fu, C.-T. et al., "A 2.4-5.4-GHz Wide Tuning-Range CMOS Reconfigurable Low-Noise Amplifier," IEEE Transactions on Microwave Theory and Techniques, vol. 56, Issue 12, Nov. 2008, IEEE, pp. 2754-2763.

Kobayashi, K. et al., "A reconfigurable S-/X-band GaN cascode LNA MMIC," 2017 IEEE Compound Semiconductor Integrated Circuit Symposium (CSICS), Oct. 2017, IEEE, 4 pages.

Rais-Zadeh, M. et al., "MEMS Switched Tunable Inductors," Journal of Microelectromechanical Systems, vol. 17, Issue 1, Feb. 2008, IEEE, pp. 78-84.

Singh, R. et al., "A 3/5 GHz Reconfigurable CMOS Low-Noise Amplifier Integrated with a Four-Terminal Phase-Change RF Switch," 2015 IEEE International Electron Devices Meeting (IEDM), Dec. 7-9, 2015, Washington, DC, IEEE, 4 pages.

Singh, T. et al., "Characterization, Optimization, and Fabrication of Phase Change Material Germanium Telluride Based Miniatured DC-67 GHz RF Switches," IEEE Transactions on Microwave Theory and Techniques, vol. 67, Issue 8, Aug. 2019, IEEE, 14 pages.

Wainstein, N. et al., "Radiofrequency Switches Based on Emerging Resistive Memory Technologies—A Survey," Proceedings of the IEEE, vol. 109, No. 1, Aug. 2020, IEEE, pp. 77-95.

Wang, F. et al., "An Artificial-Intelligence (AI) Assisted Mm-Wave Multi-Band Doherty Transmitter," 2019 IEEE MTT-S International Microwave Conference on Hardware and Systems for 5G and Beyond (IMC-5G), Aug. 2019, pp. 487-490.

Wang, F. et al., "4.8 A Highly Linear Super-Resolution Mixed-Signal Doherty Power Amplifier for High-Efficiency mm-Wave 5G Multi-GB/s Communications," 2019 IEEE International Solid-State Circuits Conference—(ISSCC), Feb. 2019, San Francisco, CA, USA, IEEE, 3 pages.

Wang, S. et al., "Tunable Inductors Using Vanadium Dioxide as the Control Material," Microwave and Optical Technology Letters, vol. 59, No. 5, May 2017, pp. 1057-1061.

Wen, C.Y. et al., "A Phase-change via-Reconfigurable On-Chip Inductor," 2010 IEEE International Electron Devices Meeting (IEDM 2020), Dec. 6-8, 2010, San Francisco, CA, IEEE, 4 pages.

Yoo, S.-S. et al., "A Compact Reconfigurable LNA for Single Path Multistandard Receiver," 2007 IEEE Conference on Electron Devices and Solid-State Circuits, Dec. 20-22, 2007, Tainan, Taiwan, IEEE, 4 pages.

Zine-El-Abidine, I. et al., "A Tunable RF MEMS Inductor," 2004 International Conference on MEMS, NANO and Smart Systems (ICMENS'04), Aug. 25-27, 2004, Banff, AB, Canada, IEEE, 3 pages.

Vinodhini, G. et al., "Reconfigurable LNA for MB-OFDM Receiver using Active Inductor," International Journal of Computer Applications, vol. 89, No. 18, Mar. 2014, 7 pages.

International Search Report and Written Opinion for International Patent Application No. PCT/US2020/060621, mailed Feb. 26, 2021, 15 pages.

International Search Report and Written Opinion for International Patent Application No. PCT/US2020/062013, mailed Mar. 31, 2021, 15 pages.

First Office Action for Chinese Patent Application No. 202080078026.1, mailed Feb. 27, 2025, 23 pages.

Notice of Allowance for Chinese Patent Application No. 202080078026.1, mailed Jul. 28, 2025, 8 pages.

* cited by examiner

RECONFIGURABLE TRANSISTOR DEVICE

RELATED APPLICATIONS

This application is a 35 USC 371 national phase filing of International Application No. PCT/US2020/060621, filed Nov. 14, 2020, which application claims the benefit of provisional patent application Ser. No. 62/935,662, filed Nov. 15, 2019, the disclosures of which are hereby incorporated herein by reference in their entireties.

FIELD OF THE DISCLOSURE

The present disclosure relates to transistors and in particular to structures for radio frequency transistors.

BACKGROUND

Silicon based digital and analog integrated circuits mimic variable total gate width periphery of a transistor device by selectively turning on and shutting off transistors in parallel that comprise the transistor device. However, off transistor parasitic capacitances, inductances, and resistances impair operational performance of transistors that remain on. Performance degradation increases in radio frequency (RF) type field-effect transistor (FET) devices such as RF amplifiers as frequency and output power increases. Isolation switches on each terminal of the FETs comprising the RF amplifier have been used to increase operational performance. However, due to modest figure-of-merits of the isolation switches there may be only a relatively slight improvement in performance. Moreover, the isolation switches are typically at least an order of magnitude larger than the active device periphery of the amplifier. Thus, there is a need for a new transistor structure that provides both compactness and relatively high isolation between transistors that are in an on-state and transistors that are in an off-state within a transistor device in order to minimize the effects of parasitics that degrade performance of the transistor device.

SUMMARY

Disclosed is a reconfigurable transistor device having a substrate with a plurality of transistor fingers disposed in a first region over the substrate and a phase change switch (PCS) having a first patch of a phase change material (PCM) disposed over the substrate in a second region to selectively couple a first set of the plurality of first transistor fingers to a first bus, wherein the first patch of the PCM is electrically insulating in an amorphous state and electrically conductive in a crystalline state. A thermal element is disposed adjacent to the first patch of the PCM, wherein the thermal element is configured to maintain the patch of the PCM to within a first temperature range until the first patch of the PCM converts to the amorphous state when electrical current within a first current range is flowing through the first thermal element and maintain the first patch of the PCM within a second temperature range until the first patch of the PCM converts to the crystalline state when electrical current is flowing through the first thermal element within a second current range.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
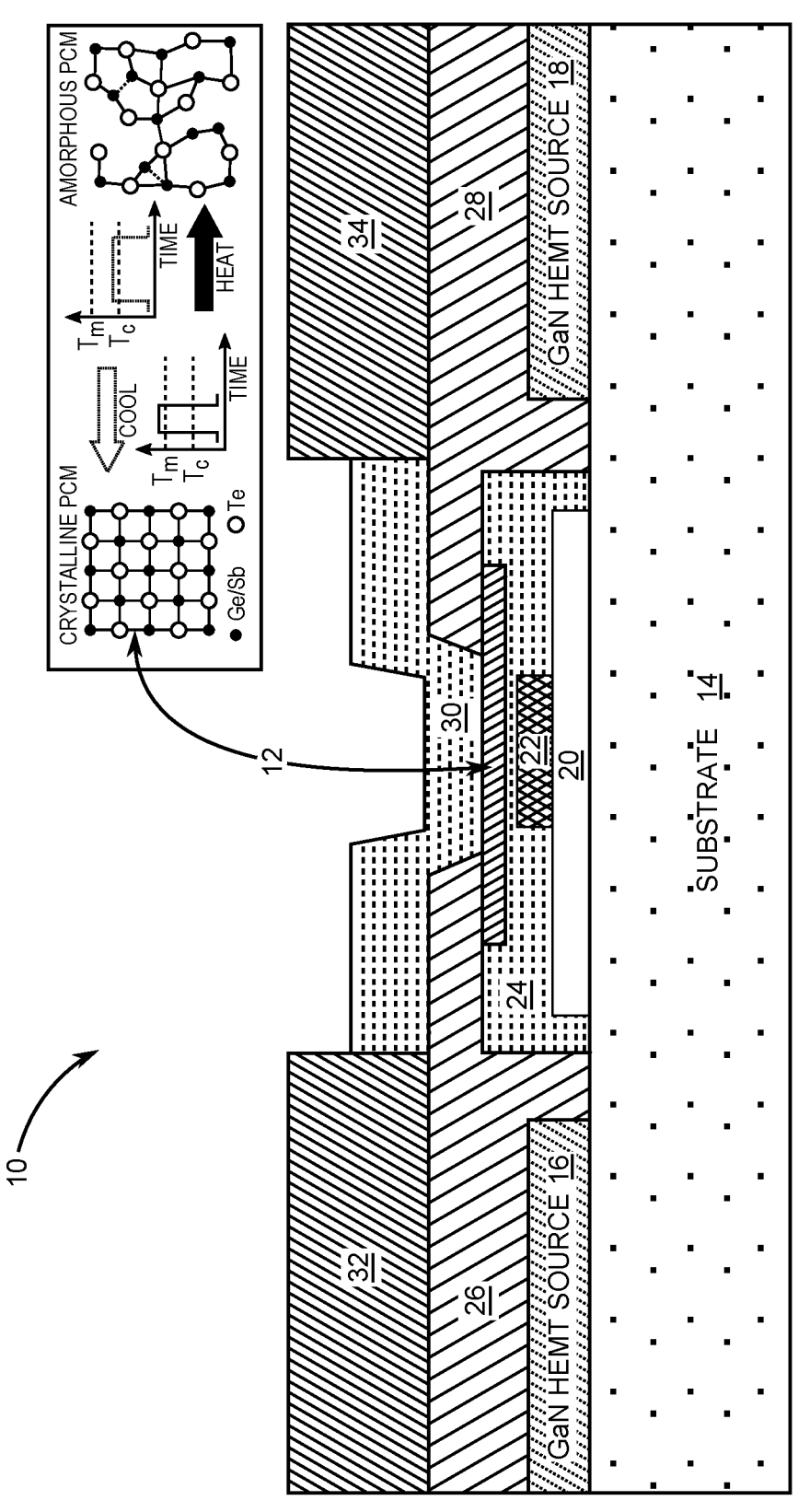
FIG. 1 is a cross-sectional view of a first embodiment of a phase change switch (PCS) that in accordance with the present disclosure is based on a phase change material (PCM).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a cross-sectional view of a first exemplary embodiment of a phase change switch (PCS) 10 that in accordance with the present disclosure is fabricated from a phase change material (PCM) 12, such as chalcogenide phase change materials, which include but are not limited to vanadium dioxide ($VO_2$), germanium telluride (GeTe), and germanium-antimony-telluride (GST). The PCS 10 includes a substrate 14 made of semiconductor material such as silicon or silicon carbide. A first semiconductor contact 16 and a second semiconductor contact 18 are laterally spaced apart and disposed over the substrate 14. In this exemplary embodiment, the first semiconductor contact 16 and the second semiconductor contact 18 are each a gallium nitride (GaN) high electron mobility transistor (HEMT) source contact. However, the first semiconductor contact 16 and the second semiconductor contact 18 may be other types of semiconductor contacts such as gate and drain contacts. Moreover, the first semiconductor contact 16 and the second semiconductor contact 18 may be made of other semiconductor materials such as gallium arsenide.

A thermal insulator layer 20 is disposed over the substrate 14 between the first semiconductor contact 16 and the second semiconductor contact 18. The thermal insulator layer 20 has a thermal conductance that is between 0.1 watts per meter-kelvin and 0.4 watts per meter-kelvin. The thermal insulator layer 20 may be made of silicon dioxide and may include an air chamber for additional insulation. A thermal element 22 is disposed over both the substrate 14 and the thermal insulator layer 20. The thermal element 22 may be made of a thermoelectric semiconductor material or an ohmic material such as used to fabricate resistors. Such materials include but are not limited to metals and carbon compounds.

A first dielectric layer 24 is disposed over both the thermal insulator layer 20 and the thermal element 22. The first dielectric layer 24 typically has a thermal conductance of at least 30 watts per meter-kelvin. In this exemplary embodiment, the first dielectric layer 24 is made of silicon nitride.

A patch of the PCM 12 is disposed over the thermal element 22, and in this exemplary embodiment, the patch of the PCM 12 is disposed over the thermal element 22 with tens of nanometers to hundreds of nanometers separating the patch of the PCM 12 from the thermal element 22. In some embodiments, the patch of the PCM 12 may reside directly onto the thermal element 22.

A first metal layer section 26 is disposed over the substrate 14 in electrical contact with both the first semiconductor contact 16 and a leftmost portion of the patch of the PCM 12. A second metal layer section 28 is disposed over the substrate 14 in electrical contact with both the second semiconductor contact 18 and a rightmost portion of the patch of the PCM 12 and being separated by a gap over the patch of the PCM 12. In this exemplary embodiment the gap is between 1 micrometer and 7 micrometers. In some embodiments the gap is between 1 micrometer and 4 micrometers. In other embodiments the gap is between 4 micrometers and 7 micrometers.

A second dielectric layer 30 is disposed within the gap over the patch of the PCM 12. A first external electrical contact 32 is disposed over the first metal layer section 26 and is electrically conductive with the first metal layer section 26 and the first semiconductor contact 16. A second external electrical contact 34 is disposed over the second metal layer section 28 and is electrically conductive with the second metal layer section 28 and the second semiconductor contact 18. The second dielectric layer 30 disposed within the gap over the patch of the PCM 12 electrically isolates the first external electrical contact 32 from the second external electrical contact 34.

In operation of the PCS 10, to place the PCS 10 into the off-state an electrical current is driven through the thermal element 22 to raise the temperature of the patch of PCM 12 from a crystallization temperature $T_c$ to a melt temperature $T_m$ for a duration of on the order of 100 nanoseconds. In this case, the melt temperature $T_m$ will cause the patch of PCM 12 to transition from crystalline to amorphous. In contrast, to place the PCS 10 into the on-state an electrical current is driven through the thermal element 22 to maintain the temperature of the patch of PCM 12 at the crystallization temperature $T_c$ for a duration of on the order of 1 microsecond. In this case, the crystallization temperature $T_c$ will cause the patch of PCM 12 to transition from amorphous to crystalline. The crystallization temperature $T_c$ and the melt temperature $T_m$ depend upon the type of PCM. In some embodiments a range for the crystallization temperature $T_c$ is between 100° C. and 300° C., and a range for the melt temperature $T_m$ is between 500° C. and 800° C.

Figure 2:
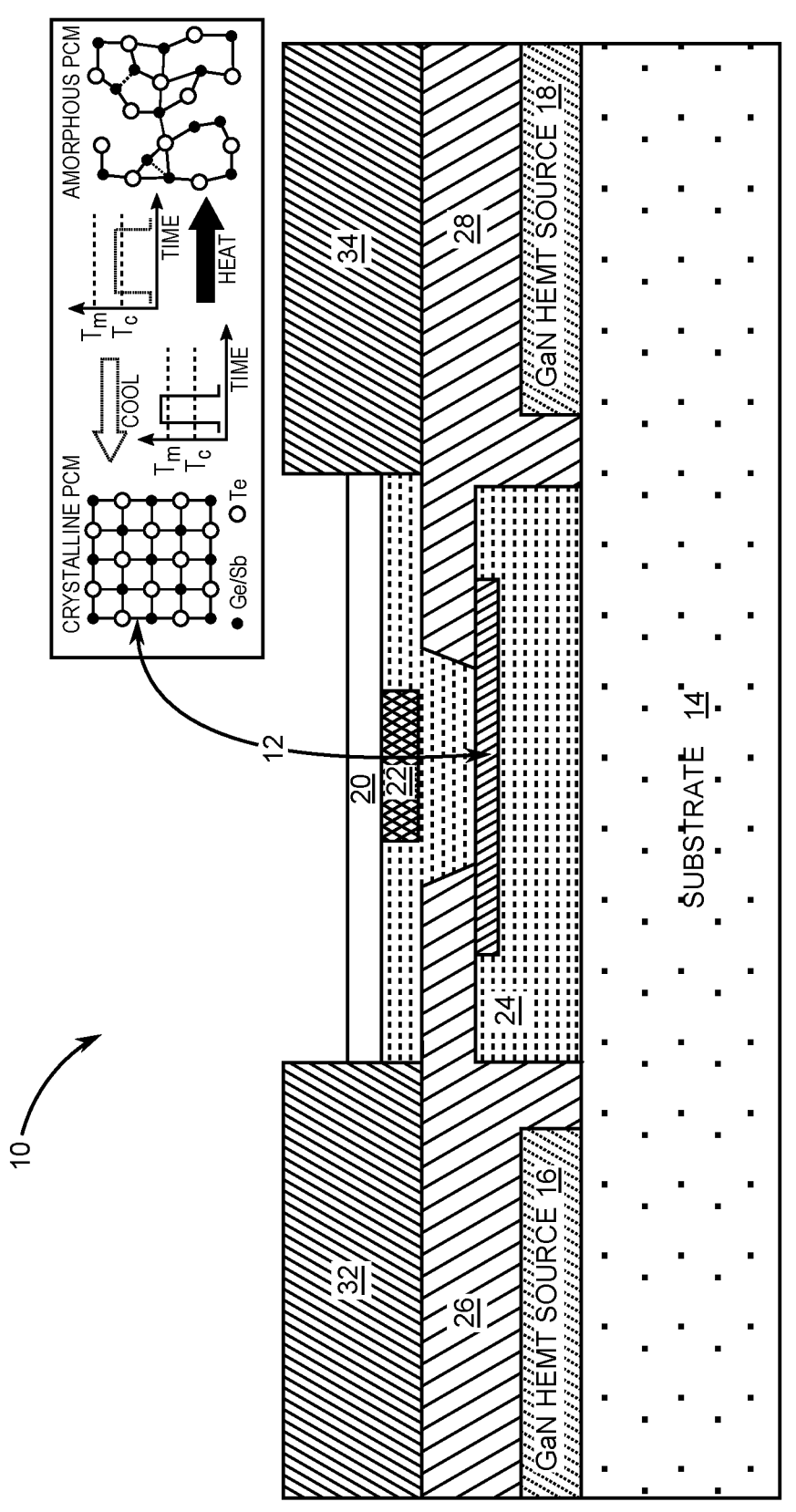
FIG. 2 is a cross-sectional view of a second embodiment of the PCS that in accordance with the present disclosure is based on the PCM.

FIG. 2 is a cross-sectional view of a second embodiment of the phase change switch (PCS) 10 that in accordance with the present disclosure is based on the phase change material (PCM) 12. In this exemplary embodiment, the first patch of the PCM 12 is sandwiched between the first thermal element 22 and the substrate 14, and the thermal insulator layer 20 is disposed over the thermal element 22. The operation of this second embodiment of the PCS 10 is substantially identical to the operation of the first embodiment of the PCS 10 depicted in FIG. 1.

Figure 3:
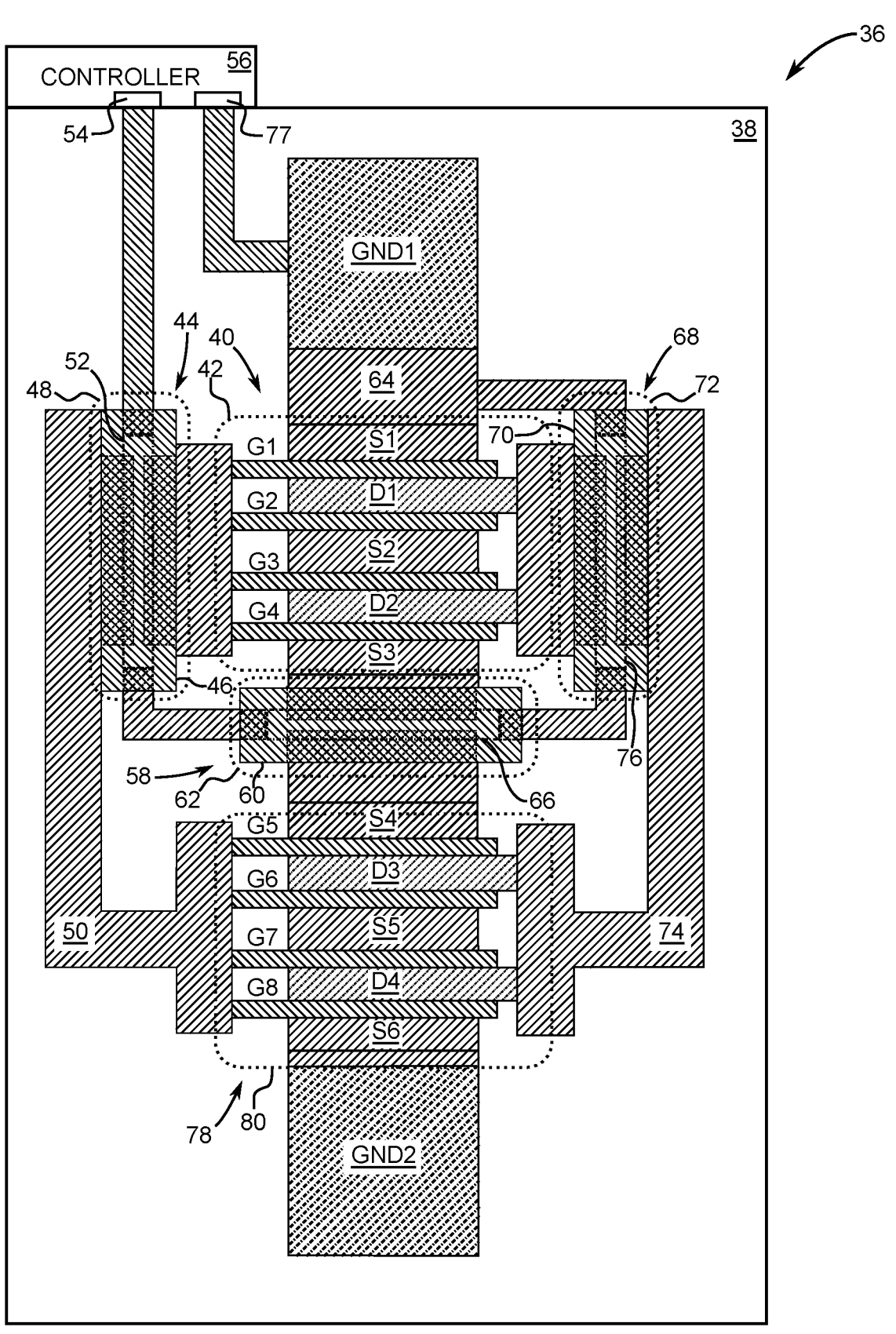
FIG. 3 is a layout view of an exemplary embodiment of reconfigurable transistor device that is structured in accordance with the present disclosure.

FIG. 3 is a layout view of an exemplary embodiment of reconfigurable transistor device 36 that is structured in accordance with the present disclosure. The reconfigurable transistor device 36 has substrate 38 and a plurality of first transistor fingers 40 disposed in a first region 42 over the substrate 38. A first phase change switch (PCS) 44 has a first patch of a phase change material (PCM) 46 disposed over the substrate 38 in a second region 48 to selectively couple a first set of the plurality of first transistor fingers 40 to a first bus 50, wherein the first patch of the PCM 46 is electrically insulating in an amorphous state and electrically conductive in a crystalline state. In this exemplary embodiment, the first bus 50 is a gate bus and the first set of the plurality of first transistor fingers 40 includes gate fingers G1, G2, G3, and G4. A first thermal element 52 is disposed adjacent to the first patch of the PCM 46, wherein the first thermal element 52 is configured to maintain the first patch of the PCM 46 to within a first temperature range until the first patch of the PCM 46 converts to the amorphous state when electrical current within a first current range is flowing through the first thermal element 52 and maintain the first patch of the PCM 46 within a second temperature range until the first patch of the PCM 46 converts to the crystalline state when electrical current is flowing through the first thermal element 52 within a second current range. In an exemplary embodiment, the first current range is between 200 milliamperes and 500 milliamperes and the second current range is between 700 milliamperes and 1000 milliamperes. However, it is to be understood that the first current range and the second current range are dependent on the physical size and resistivity of first thermal heater element 52, thin film resistor layer thickness, etc. Therefore, other current magnitudes for the first current range and the second current range that can produce the first temperature range and the second temperature range, respectively.

The first thermal element 52 is configured to couple to one or more outputs 54 of a controller 56, wherein electrical current flows through the first thermal element 52 within the first current range for a first duration when the controller 56 generates a first output voltage range at the one or more outputs 54 for the first duration and electrical current flows through first thermal element 52 within the second current range for a second duration when the controller 56 generates a second output voltage range at the one or more outputs 54 for the second duration. The first PCS 44 may have the structure of either the first embodiment of PCS 10 depicted in FIG. 1 or the structure of the second embodiment of the PCS 10 depicted in FIG. 2.

The reconfigurable transistor device 36 further includes a second PCS 58, which has a second patch of the PCM 60 disposed over the substrate 38 in a third region 62 to selectively couple a second set of the plurality of first transistor fingers 40 to a second bus 64, wherein the second patch of the PCM 60 is electrically insulating in the amorphous state and electrically conductive in the crystalline state. In this exemplary embodiment, the second bus 64 is a source bus and the second set of the plurality of first transistor fingers 40 includes source fingers S1, S2, and S3.

A second thermal element 66 is disposed adjacent to the second patch of the PCM 60, wherein the second thermal element 66 is configured to maintain the second patch of the PCM 60 within the first temperature range until the second patch of the PCM 60 converts to the amorphous state when electrical current within the first current range is flowing through the second thermal element 66 and maintain the second patch of the PCM 60 within the second temperature range until the second patch of the PCM 60 converts to the crystalline state when electrical current is flowing through the second thermal element 66 within the second current range.

The second thermal element 66 is configured to couple to the one or more outputs 54 of the controller 56, wherein electrical current flows through the second thermal element 66 within the first current range for the first duration when the controller 56 generates the first output voltage range at the one or more outputs for the first duration and electrical current flows through second thermal element 66 within the second current range for the second duration when the controller 56 generates the second output voltage range at the one or more outputs 54 for the second duration. The second PCS 58 may have the structure of either the first embodiment of PCS 10 depicted in FIG. 1 or the structure of the second embodiment of the PCS 10 depicted in FIG. 2.

The reconfigurable transistor device 36 further includes a third PCS 68, which has a third patch of the PCM 70 disposed over the substrate 38 in a fourth region 72 to selectively couple a third set of the plurality of first transistor fingers 40 to a third bus 74, wherein the third patch of the PCM 70 is electrically insulating in the amorphous state and electrically conductive in the crystalline state. In this exemplary embodiment, the third bus is a drain bus and the third set of the plurality of first transistor fingers 40 includes drain fingers D1 and D2.

A third thermal element 76 is disposed adjacent to the third patch of the PCM 70, wherein the third thermal element 76 is configured to maintain the third patch of the PCM 70 within the first temperature range for the first duration when electrical current within the first current range is flowing through the third thermal element 76 and maintain the third patch of the PCM 70 within the second temperature range for the second duration when electrical current is flowing through the third thermal element 76 within the second current range.

The third thermal element 76 is configured to couple to the one or more outputs 54 of the controller 56, wherein electrical current flows through the third thermal element 76 at the first current range for the first duration when the controller 56 generates the first output voltage range at the one or more outputs 54 for the first duration and electrical current flows through third thermal element 76 at the second current range for the second duration when the controller 56 generates the second output voltage range at the one or more outputs 54 for the second duration. The third PCS 68 may have the structure of either the first embodiment of PCS 10 depicted in FIG. 1 or the structure of the second embodiment of the PCS 10 depicted in FIG. 2. The third thermal element completes a circuit to a ground terminal 77 of the controller 56 by way of a ground via GND1, which may couple to the substrate 38.

The reconfigurable transistor device 36 also includes a plurality of second transistor fingers 78 disposed in a fifth region 80 over the substrate 38, wherein a first set of the plurality of second transistor fingers 78 is coupled to the first bus 50, a second set of the plurality of second transistor fingers 78 is coupled to the second bus 64, and a third set of the plurality of second transistor fingers 78 is coupled to the third bus 74. In this exemplary embodiment, the first set of the plurality of second transistor fingers 78 includes gate fingers G5, G6, G7, and G8, whereas the second set of the plurality of second transistor fingers 78 includes source fingers S4, S5, and S6. The source finger S6 may be grounded by way of a second ground via GND2. The third set of the plurality of second transistor fingers 78 includes drain fingers D3 and D4.

The source finger S3 and the source finger S4 are adjacent source fingers of the plurality of first transistors fingers 40 and the plurality of the second transistor fingers 78. The second PCS 58 is interdigitated with the source finger S3 and the source finger S4. In some embodiments the source finger S3 and the source finger S4 are separated by the second PCS 58 by between 40 micrometers and 50 micrometers. In other embodiments, the source finger S3 and the source finger S4 are separated by between 30 micrometers and 40 micrometers. In yet other embodiments, the source finger S3 and the source finger S4 are separated between 20 micrometers and 30 micrometers. In still other embodiments, the source finger S3 and the source finger S4 are separated between 1 micrometer and 20 micrometers.

In some embodiments, the plurality of first transistor fingers 40 and the plurality of second transistor fingers 78 are fabricated in gallium nitride technology. In some embodiments the reconfigurable transistor device 36 has a switch figure of merit of between 10 terahertz and 35 terahertz. In some embodiments, the first PCS 44, the second PCS 58, and the third PCS 68 each have an on-state resistance that is between $0.1\Omega$ and $1.0\Omega$. In other embodiments, the first PCS 44, the second PCS 58, and the third PCS 68 each have an on-state resistance that is between $0.1\Omega$ and $0.5\Omega$. In still other embodiments, the first PCS 44, the second PCS 58, and the third PCS 68 each have an on-state resistance that is between $0.5\Omega$ and $1.0\Omega$. In some embodiments, the first PCS 44, the second PCS 58, and the third PCS 68 each have an off-state resistance that is between $1000\Omega$ and $1,000,000\Omega$. In other embodiments, the first PCS 44, the second PCS 58, and the third PCS 68 each have an off-state resistance that is between $1000\Omega$ and $500,000\Omega$. In other embodiments, the first PCS 44, the second PCS 58, and the third PCS 68 each have an off-state resistance that is between $500,000\Omega$ and $1,000,000\Omega$. In some embodiments, the first PCS 44, the second PCS 58, and the third PCS 68 each have an off-state capacitance between 0.5 picofarads and 0.001 picofarads. In other embodiments, the first PCS 44, the second PCS 58, and the third PCS 68 each have an off-state capacitance between 0.5 picofarads and 0.1 picofarads. In still other embodiments, the first PCS 44, the second PCS 58, and the third PCS 68 each have an off-state capacitance between 0.1 picofarads and 0.001 picofarads.

Figure 4:
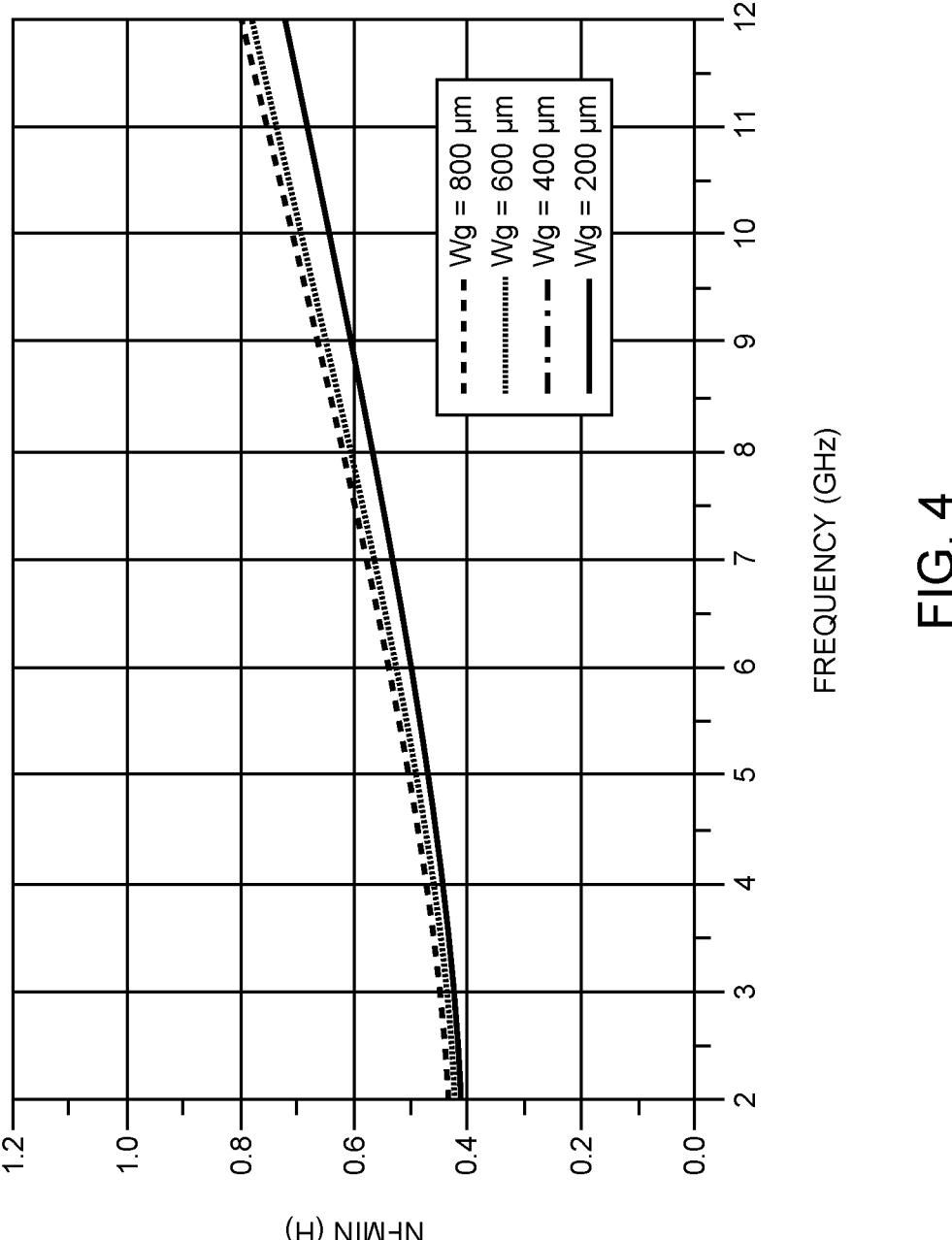
FIG. 4 is a graph of minimum noise factor NFmin over frequency for a reconfigurable transistor device having four parallel transistors, each having PCS switches configured for isolation like the reconfigurable transistor device depicted in FIG. 3.

FIG. 4 is a graph of minimum noise factor NFmin over a frequency range between 2 GHz and 12 GHz for a reconfigurable transistor device having four parallel transistors each having PCS switches configured for isolation like the reconfigurable transistor device 36 depicted in FIG. 3. The minimum noise factor has only a modest degradation while switching between total gate widths of 800 micrometers to 200 micrometers.

Figure 5:
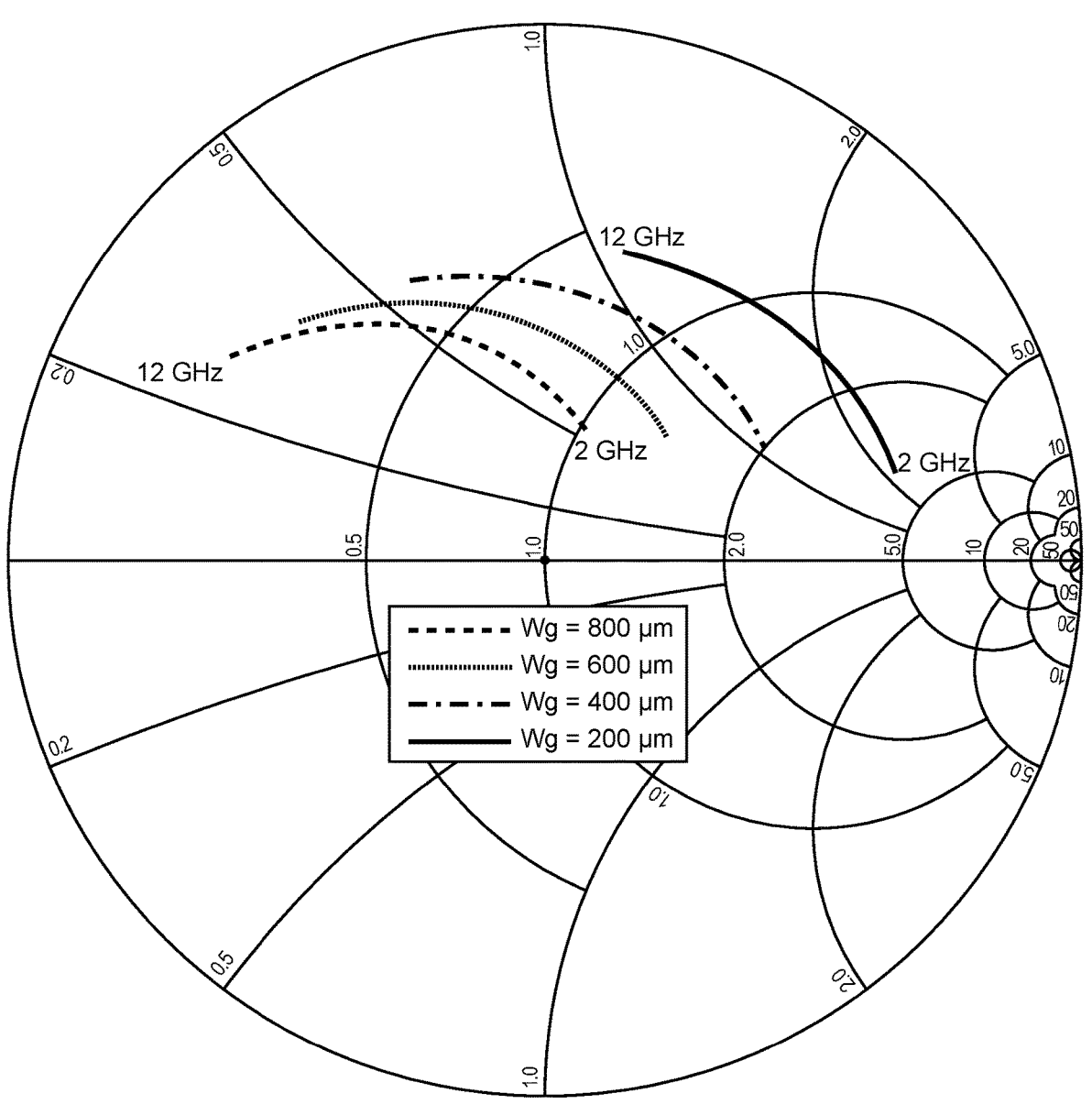
FIG. 5 is a Smith chart illustrating optimal gamma for a reconfigurable transistor device having four parallel transistors, each having PCS switches configured for isolation like the reconfigurable transistor device depicted in FIG. 3.

FIG. 5 is a Smith chart illustrating optimal gamma for a reconfigurable transistor device having four parallel transistors each having PCS switches configured for isolation like the reconfigurable transistor device 36 depicted in FIG. 3. The optimal gamma shift afforded by the PCS switches provides a relatively major improvement of typical isolation techniques for reconfigurable transistor devices as compared with non-switched isolated transistors that vary effective gate width by solely turning on or off the bias of the transistors.

Figure 6:
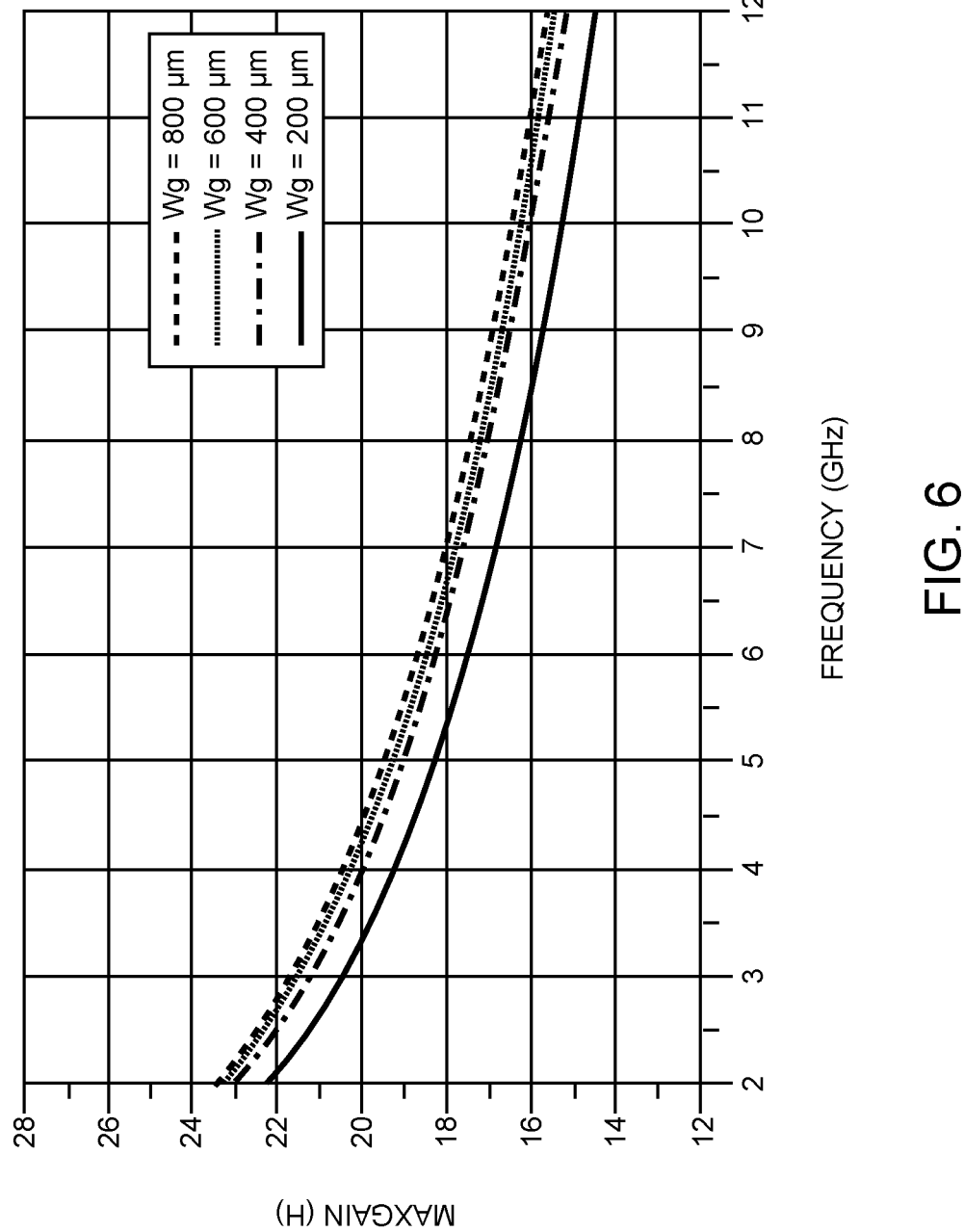
FIG. 6 is a graph of maximum gain over frequency for a reconfigurable transistor device having four parallel transistors, each having PCS switches configured for isolation like the reconfigurable transistor device depicted in FIG. 3.

FIG. 6 is a graph of maximum gain MaxGain over a frequency range between 2 GHz and 12 GHz for a reconfigurable transistor device having four parallel transistors each having PCS switches configured for isolation like the reconfigurable transistor device depicted in FIG. 3. The maximum gain has only a modest degradation while switching between total gate widths of 800 micrometers to 200 micrometers.

Those skilled in the art will recognize improvements and modifications to the preferred embodiments of the present disclosure. All such improvements and modifications are considered within the scope of the concepts disclosed herein and the claims that follow.

What is claimed is:

1. A reconfigurable transistor device comprising:
a substrate;
a plurality of first transistor fingers made of gallium nitride disposed in a first region over the substrate;
a first phase change switch (PCS) comprising:
a first patch of a phase change material (PCM) disposed over the substrate in a second region to selectively couple a first set of the plurality of first transistor fingers to a first bus, wherein the first patch of the PCM is electrically insulating in an amorphous state and electrically conductive in a crystalline state; and
a first thermal element disposed adjacent to the first patch of the PCM, wherein the first thermal element is configured to maintain the first patch of the PCM to within a first temperature range until the first patch of the PCM converts to the amorphous state when electrical current within a first current range is flowing through the first thermal element and maintain the first patch of the PCM within a second temperature range until the first patch of the PCM converts to the crystalline state when electrical current is flowing through the first thermal element within a second current range; and
a plurality of second transistor fingers disposed in a third region over the substrate, wherein a first set of the plurality of second transistor fingers is coupled to the first bus, a second set of the plurality of second transistor fingers is coupled to a second bus and a third set of the plurality of second transistor fingers is coupled to a third bus, wherein the first set of the plurality of first transistor fingers and the first set of the plurality of second transistors are gate fingers, and the first bus is a gate bus.

2. The reconfigurable transistor device of claim 1 wherein the first thermal element is configured to couple to one or more outputs of a controller, wherein electrical current flows through the first thermal element within the first current range for a first duration when the controller generates a first output voltage range at the one or more outputs for the first duration and electrical current flows through first thermal element within the second current range for a second duration when the controller generates a second output voltage range at the one or more outputs for the second duration.

3. The reconfigurable transistor device of claim 2 further comprising:
a second PCS comprising:
a second patch of the PCM disposed over the substrate in a fourth region to selectively couple a second set of the plurality of first transistor fingers to a second bus, wherein the second patch of the PCM is electrically insulating in the amorphous state and electrically conductive in the crystalline state; and
a second thermal element disposed adjacent to the second patch of PCM, wherein the second thermal element is configured to maintain the second patch of the PCM within the first temperature range until the second patch of PCM converts to the amorphous state when electrical current within the first current range is flowing through the second thermal element and maintain the second patch of the PCM within the second temperature range until the second patch of the PCM converts to the crystalline state when electrical current is flowing through the second thermal element within the second current range.

4. The reconfigurable transistor device of claim 3 wherein the second thermal element is configured to couple to the one or more outputs of the controller, wherein electrical current flows through the second thermal element within the first current range for the first duration when the controller generates the first output voltage range at the one or more outputs for the first duration and electrical current flows through second thermal element within the second current range for the second duration when the controller generates the second output voltage range at the one or more outputs for the second duration.

5. The reconfigurable transistor device of claim 4 further comprising:

a third PCS comprising:

a third patch of the PCM disposed over the substrate in a fifth region to selectively couple a third set of the plurality of first transistor fingers to a third bus, wherein the third patch of the PCM is electrically insulating in the amorphous state and electrically conductive in the crystalline state; and a third thermal element disposed adjacent to the third patch of PCM, wherein the third thermal element is configured to maintain the third patch of the PCM within the first temperature range for the first duration when electrical current within the first current range is flowing through the third thermal element and maintain the third patch of the PCM within the second temperature range for the second duration when electrical current is flowing through the third thermal element within the second current range.

6. The reconfigurable transistor device of claim 5 wherein the third thermal element is configured to couple to the one or more outputs of the controller, wherein electrical current flows through the third thermal element at the first current range for the first duration when the controller generates the first output voltage range at the one or more outputs for the first duration and electrical current flows through the third thermal element at the second current range for the second duration when the controller generates the second output voltage range at the one or more outputs for the second duration.

7. The reconfigurable transistor device of claim 1 wherein the first current range is between 200 milliamperes and 500 milliamperes and the second current range is between 700 milliamperes and 1000 milliamperes.

8. The reconfigurable transistor device of claim 1 wherein the first patch of the PCM is vanadium dioxide ($VO_2$).

9. The reconfigurable transistor device of claim 1 wherein the first patch of the PCM is germanium telluride (GeTe).

10. The reconfigurable transistor device of claim 1 wherein the first PCS has an on-state resistance that is between 0.1Ω and 1.0Ω.

11. The reconfigurable transistor device of claim 1 wherein the first PCS has an off-state resistance that is between 1000Ω and 1,000,000Ω.

12. The reconfigurable transistor device of claim 1 wherein the first PCS has an off-state capacitance between 0.5 picofarads and 0.001 picofarads.

13. The reconfigurable transistor device of claim 1 having a switch figure of merit of between 10 terahertz and 35 terahertz.

14. The reconfigurable transistor device of claim 1 wherein the first temperature range is between 500° C. and 800° C.

15. The reconfigurable transistor device of claim 14 wherein the second temperature range is between 100° C. and 300° C.

16. The reconfigurable transistor device of claim 1 wherein the substrate comprises silicon carbide.

17. The reconfigurable transistor device of claim 1 wherein the second set of the plurality of first transistor fingers and the second set of the plurality of second transistor fingers are source fingers, and the second bus is a source bus.

18. The reconfigurable transistor device of claim 1 wherein adjacent source fingers of the plurality of first transistors fingers and the plurality of the second transistor fingers are separated by the second PCS by a distance of between 40 micrometers and 50 micrometers.

19. The reconfigurable transistor device of claim 1 wherein adjacent source fingers of the plurality of first transistors fingers and the plurality of the second transistor fingers are separated by the second PCS by a distance of between 30 micrometers and 40 micrometers.

20. The reconfigurable transistor device of claim 1 wherein adjacent source fingers of the plurality of first transistors fingers and the plurality of the second transistor fingers are separated by the second PCS by a distance of between 20 micrometers and 30 micrometers.

21. The reconfigurable transistor device of claim 1 wherein adjacent source fingers of the plurality of first transistors fingers and the plurality of the second transistor fingers are separated by the second PCS by a distance of between 1 micrometer and 20 micrometers.

22. The reconfigurable transistor device of claim 1 wherein the third set of the plurality of first transistor fingers and the third set of the plurality of second transistor fingers are drain fingers, and the third bus is a drain bus.

23. The reconfigurable transistor device of claim 1 wherein the first thermal element is sandwiched between the first patch of the PCM and the substrate.

24. The reconfigurable transistor device of claim 23 further comprising a thermal insulator layer disposed between the first thermal element and the substrate.

25. The reconfigurable transistor device of claim 24 wherein the thermal insulator layer has a thermal conductance that is between 0.1 watts per meter-kelvin and 0.4 watts per meter-kelvin.

26. The reconfigurable transistor device of claim 1 wherein the first patch of the PCM is sandwiched between the first thermal element and the substrate.

27. The reconfigurable transistor device of claim 1 further comprising a thermal insulator layer disposed over the first thermal element.

* * * * *